(12) United States Patent
Hirayama

(10) Patent No.: US 8,161,211 B2
(45) Date of Patent: Apr. 17, 2012

(54) STORAGE SYSTEM AND DATA PROCESSING METHOD FOR THE SAME

(75) Inventor: Hiroshi Hirayama, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 518 days.

(21) Appl. No.: 12/310,815

(22) PCT Filed: Feb. 25, 2009

(86) PCT No.: PCT/JP2009/054004
§ 371 (c)(1),
(2), (4) Date: Mar. 9, 2009

(87) PCT Pub. No.: WO2010/097960
PCT Pub. Date: Sep. 2, 2010

(65) Prior Publication Data
US 2011/0238914 A1     Sep. 29, 2011

(51) Int. Cl.
*G06F 13/28* (2006.01)
*G06F 12/08* (2006.01)
*G06F 13/00* (2006.01)

(52) U.S. Cl. ............... 710/68; 710/1; 711/112; 711/118; 711/154; 711/164

(58) Field of Classification Search .................. 710/68, 710/1; 711/154, 118, 162
See application file for complete search history.

(56) References Cited

U.S. PATENT DOCUMENTS

| 6,928,526 | B1 |   | 8/2005 | Zhu et al. |   |
|---|---|---|---|---|---|
| 7,065,619 | B1 | * | 6/2006 | Zhu et al. | 711/162 |
| 7,562,186 | B2 | * | 7/2009 | Li et al. | 711/112 |
| 7,788,456 | B1 | * | 8/2010 | Park | 711/161 |
| 7,886,120 | B1 | * | 2/2011 | Tormasov | 711/162 |
| 7,949,824 | B2 | * | 5/2011 | Zhu | 711/112 |
| 2008/0183767 | A1 | * | 7/2008 | Zhu et al. | 707/200 |

FOREIGN PATENT DOCUMENTS

WO    WO 03/081433  A1    3/2002

OTHER PUBLICATIONS

International Search Report mailed Jul. 10, 2009.

* cited by examiner

*Primary Examiner* — Tammara Peyton
(74) *Attorney, Agent, or Firm* — Stites & Harbison, PLLC; Juan Carlos A. Marquez, Esq.

(57)     ABSTRACT

The present invention aims for efficient use of storage capacity in a storage system by reducing the amount of time taken for processing including removing redundancy and data compression executed with respect to transferred data.

Focusing on data patterns included in transferred data, the most suitable pattern is detected, and de-duplication processing is gradually executed. Data compression is then executed with data after de-duplication as a target. Determination of the decision for execution of gradual de-duplication processing, or execution of compression processing is made depending on the amount of data remaining at each processing stage and the system load.

8 Claims, 15 Drawing Sheets

| Block LA | Segment* | Destaging | Hash mean | Destaging LA |
|---|---|---|---|---|
| 0x0000 | 0x0000 | No | — | 0xFF00 |
| 0x0001 | | | | 0xFF01 |
| .... | | | | .... |
| 0x0007 | | | | 0xFF07 |
| 0x0008 | 0x0001 | No | — | 0xFF08 |
| 0x0009 | | | | 0xFF09 |
| .... | | | | .... |
| 0x000F | | | | 0xFF0F |
| .... | | | | |
| 0xFF00 | 0x1F00 | Yes | 0x000012 | 0xFF00 |
| 0xFF01 | | | | 0xFF01 |
| .... | | | | .... |
| 0xFF07 | | | | 0xFF07 |
| 0xFF08 | 0x1F01 | Yes | 0x000034 | 0xFF08 |
| 0xFF09 | | | | 0xFF09 |
| .... | | | | .... |
| 0xFF0F | | | | 0xFF0F |

\* 1segument = 8 Blocks (4KB)

FIG.11

| Block LA | Segment* | De-duplication | Compression | Destaging LA |
|---|---|---|---|---|
| 0x0000 | 0x0000 | Fixing | No | 0xFFF0 |
| 0x0001 | | | | |
| .... | | | No | |
| 0x0007 | | | | |
| 0x0008 | 0x0001 | Random | No | 0xFF08 |
| 0x0009 | | | | 0xFF09 |
| .... | | | No | .... |
| 0x000F | | | | 0xFF0F |
| 0x0010 | 0x0002 | No | No | 0x0000 |
| 0x0011 | | | | 0x0001 |
| 0x0012 | | | No | 0x0002 |
| 0x0013 | | | | 0x0003 |
| 0x0014 | | | Yes | 0x0004 |
| 0x0015 | | | | |
| 0x0016 | | | Yes | 0x0005 |
| 0x0017 | | | | |
| 0x0018 | 0x0003 | No | Yes | 0x0006 |
| 0x0019 | | | | |
| 0x001A | | | Yes | 0x0007 |
| 0x001B | | | | |
| 0x001C | | | Over Flow | 0x0008 |
| 0x001D | | | | 0x0009 |
| 0x001E | | | Over Flow | 0x000A |
| 0x001F | | | | 0x000B |
| 0x0020 | 0x0004 | No | No | 0x000C |
| 0x0021 | | | | 0x000D |
| 0x0022 | | | No | 0x000E |
| 0x0023 | | | | 0x000F |
| 0x0024 | | | No | 0x0010 |
| 0x0025 | | | | 0x0011 |
| 0x0026 | | | No | 0x0012 |
| 0x0027 | | | | 0x0013 |
| ... | ... | ... | ... | ... |

* 1 segument = 8 Blocks (4KB)

STORAGE SYSTEM AND DATA PROCESSING METHOD FOR THE SAME

TECHNICAL FIELD

This invention relates to a storage system and a data processing method in the storage system.

BACKGROUND ART

Conventionally, storage systems have stored transfer information transferred from a higher-level device (host) temporarily in cache memory, and then stored it in a storage device such as a hard disk. Recently, a technology has been proposed in which a storage system detects redundancy between transfer information and information already stored in a storage system, and transfer information determined as being redundant is not stored in a storage device. By preventing the storage system from storing such "redundant information" in the storage device, the physical storage capacity can be utilized effectively, and as a result the apparent storage capacity that the storage system shows to the host can be increased.

An example of such redundancy detection is described in U.S. Pat. No. 6,928,526. The storage system processes transfer information in units of segments and calculates the representative value and the feature value (hash mean) for data included in each segment. In addition, the storage system avoids writing identical information to the storage device by comparing the hash mean of the transfer information with the hash mean for the storage information stored in the storage device.

Meanwhile, another method of effectively utilizing storage capacity is data compression. In storage systems, algorithms that allow lossless compression are utilized. The LZ encoding algorithm. is a representative example of such algorithms.

DISCLOSURE OF THE INVENTION

Description of the Related Art

The storage system determines information redundancy by dividing the data included in transfer information into segments. A segment comprises multiple blocks (e.g. 512 bytes each) that are the units by which the storage system accesses the storage device. It is preferable that the probability of redundancy detection is increased by keeping the amount of data per segment small, from several kilobytes to tens of megabytes.

However, as there are more segments, the capacity of the hash mean management table increases significantly, and it takes more time to detect redundancy between transfer information and stored information. In addition, as there are more segments, the operation to obtain the hash mean requires an algorithm with greater uniqueness (e.g. SHA: Secure Hash Algorithm) to avoid any hash mean conflict. In such algorithms the number of operations is large and processing latency increases.

Furthermore, the quantity of data transferred from higher-level devices to storage systems has significantly increased recently. To handle this, the storage capacity of storage systems has been changed to the level of terabytes and petabytes. As a result, the number of operations for examining redundancy also keeps increasing.

In light of this, there has been a problem whereby, in the high-precision detection of redundancy in storage systems, the processing time increases and the I/O performance of the storage system with respect to higher-level computers deteriorates.

Furthermore, if storage systems attempt to compress a large quantity of data and store all of it in a storage device, the storage device eventually fails to be effectively utilized, and in addition, it takes time to compress and decompress the data.

Therefore, an objective of this invention is, with a view to solving the issues above, enablingment of a storage system to utilize the storage capacity of a storage device effectively and, at the same time, prevention of an increase in the amount of processing time required for data compression and decompression.

Furthermore, another objective of this invention is, while the storage system executes high-precision redundancy detection between transfer information transferred from a higher-level device and storage information stored in a storage device, prevention of an increase in the amount of processing time for redundancy determination, by improving the operation efficiency for that operation.

SUMMARY OF THE INVENTION

In order to achieve the above-mentioned objectives, this invention is characterized by, with respect to a storage system and a data processing method for the storage system, effectively utilizing the storage capacity of the storage device by compressing the remaining information except for the redundant parts of transfer information that already exist in the storage device, and by storing it in the storage device.

Furthermore, another invention to achieve the above mentioned objectives is characterized in that the storage system focuses on the patterns of the data combinations that make up transfer information and executes the operations for redundancy determination to the remaining part of information except for the parts of information with specific patterns among transfer information.

A useful embodiment of this invention is characterized in that the storage system executes the operations for redundancy determination to, from among transfer information, the random information in which the data combination is configured by random patterns, not the fixed information in which the data combination is configured by regular patterns, thus reduces the amount of data to be the object of redundancy determination, and increases the efficiency of the processing for redundancy determination.

EFFECTS OF THE INVENTION

This invention enables the storage system to utilize the storage capacity of the storage device effectively, and at the same time, to prevent the amount of processing time required for data compression and decompression from increasing. In addition, while the storage system executes the high-precision redundancy determination for the transfer information from the higher-level device and the storage information stored in the storage device, the amount of processing time for redundancy determination can be prevented from increasing by improving the operation efficiency for that operation.

BRIEF DESCRIPTION OF THE DRAWINGS

FIG. 10 is an explanatory diagram of a configuration example of a hash table.

FIG. 11 is an explanatory diagram of a configuration example of a segment table.

Figure 1:
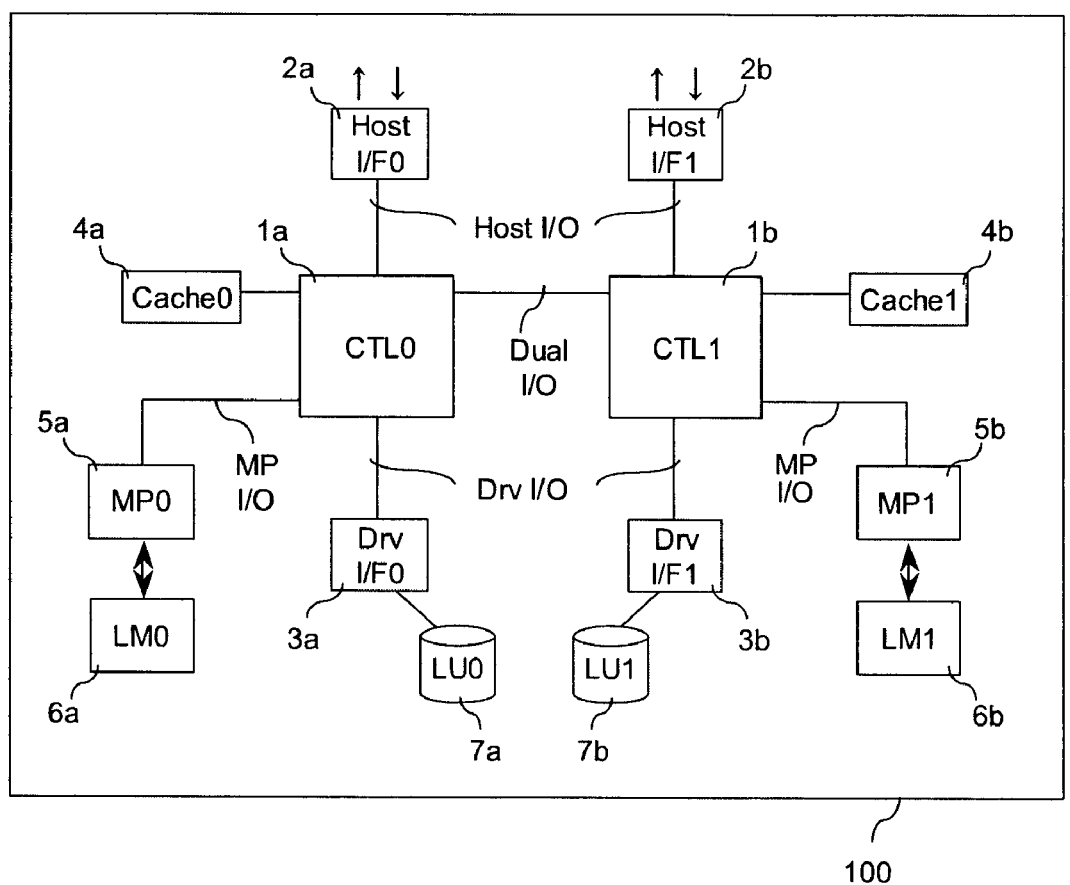
FIG. 1 is a block diagram showing the configuration of a storage system in which this invention is utilized.

1 Controller
2 Host interface
3 Drive interface
4 Cache memory
5 Microprocessor
6 Local memory
7 Storage device
8 HDMA
9 Means to detect fixed data
10 Means to detect random data
11 Means to compress data
12 DDMA

DESCRIPTION OF THE PREFERRED EMBODIMENTS

This section describes an embodiment of this invention using the figures. Note that the invention is not limited to the embodiments described below.

FIG. 1 is a block diagram showing the configuration of the storage system 100 related to this invention. FIG. 1 is a block diagram showing a configuration example of the storage system 100. The storage system has a first controller (CTL1: 1a) and a second controller (CTL0: 1b) that are redundant. The two controllers are connected by Dual I/O.

To each of the controllers, devices including a cache memory (Cache0: 4a or Cache1: 4b), a host interface (Host I/F0: 2a or Host I/F1: 2b), a drive interface (Dry I/F0: 3a or Dry I/F1: 3b), and a microprocessor (MP0: 5a or MP1: 5b) are connected. Each of the controllers controls information and data transfer via I/O (information and data transfer paths) among multiple devices.

The host interfaces 2a and 2b are the interfaces that control information transfer with the higher-level devices (hosts) in units of packets according to a communication protocol. The drive interfaces 3a and 3b are interfaces that control information transfer with storage devices (HDD, SSD etc.) in units of blocks (units of access for a storage device) according to the communication protocol.

The cache memories 4a and 4b are devices that temporarily store transfer data from the host interfaces 2a and 2b and the drive interfaces 3a and 3b. The storage system, due to the presence of the cache memories 4a and 4b, can separate host access from writes to the storage device (destaging), speed up the system's response to host access, and improve the read performance by cache hits.

To the drive interfaces 3a and 3b, storage devices are connected and logical volumes 7a and 7b (LU0, LU1, LU: Logical Unit), which are the access spaces seen from the host, are assigned, and the logical volumes are managed by the microprocessors 5a and 5b (MP0 and MP1).

The microprocessors 5a and 5b form the control parts or the control means for the controllers 1a and 1b and the host interfaces 2a and 2b. The information required for the control executed by each microprocessor is stored in the local memory (LM0: 7a or LM1: 7b). Note that, though the cache memory 4 is described as connected to the controller 1, integration of the cache memory with the local memory 6 connected to the microprocessor 5 may also be permitted.

Figure 2:
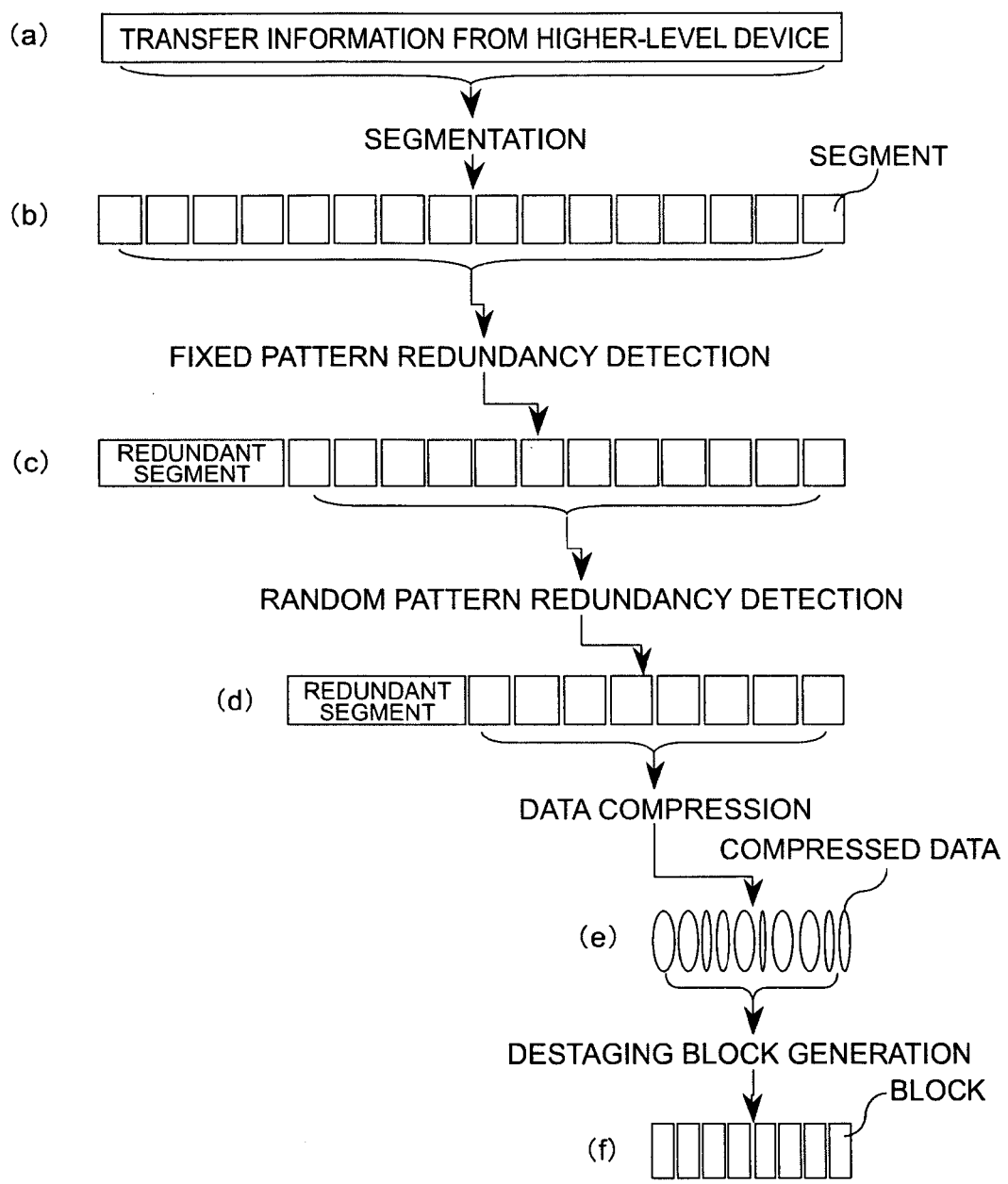
FIG. 2 is an explanatory diagram showing the process of de-duplication for transfer data and data compression.

Next, each of the principles of excluding the above mentioned "information redundancy" and executing "information compression" realized by the storage system 100 will be described. FIG. 2 is a block diagram that describes this. The operation for excluding "information redundancy" is followed by the operation of "information compression."

(a) in FIG. 2 shows the information transferred from the higher-level device to the storage system (transfer information). (a) is also a part of the access space (volume space) of the storage area of the storage system seen from the higher-level device.

(b) in FIG. 2 shows that the redundancy detection and determination in transfer information and de-duplication, which means not storing the redundancy information in the storage device, are executed in units of segments. The storage system achieves the processing related to redundant information by splitting transfer information into multiple segments or by processing it in each segment. The storage system makes the amount of data per segment an integral multiple of a block (e.g. 512 bytes), for example, and thus keeps it consistent with the unit for storage for the storage device (destaging block).

Transfer information can be classified into "fixed pattern," which means the combination of multiple pieces of data that comprise the transfer information is regular, and "random pattern," which means the combination is random. Cases where multiple pieces of data are the same or where multiple pieces of data are placed regularly or repeated periodically are examples of the former pattern. Such cases are described with reference to FIG. 3.

Figure 3:
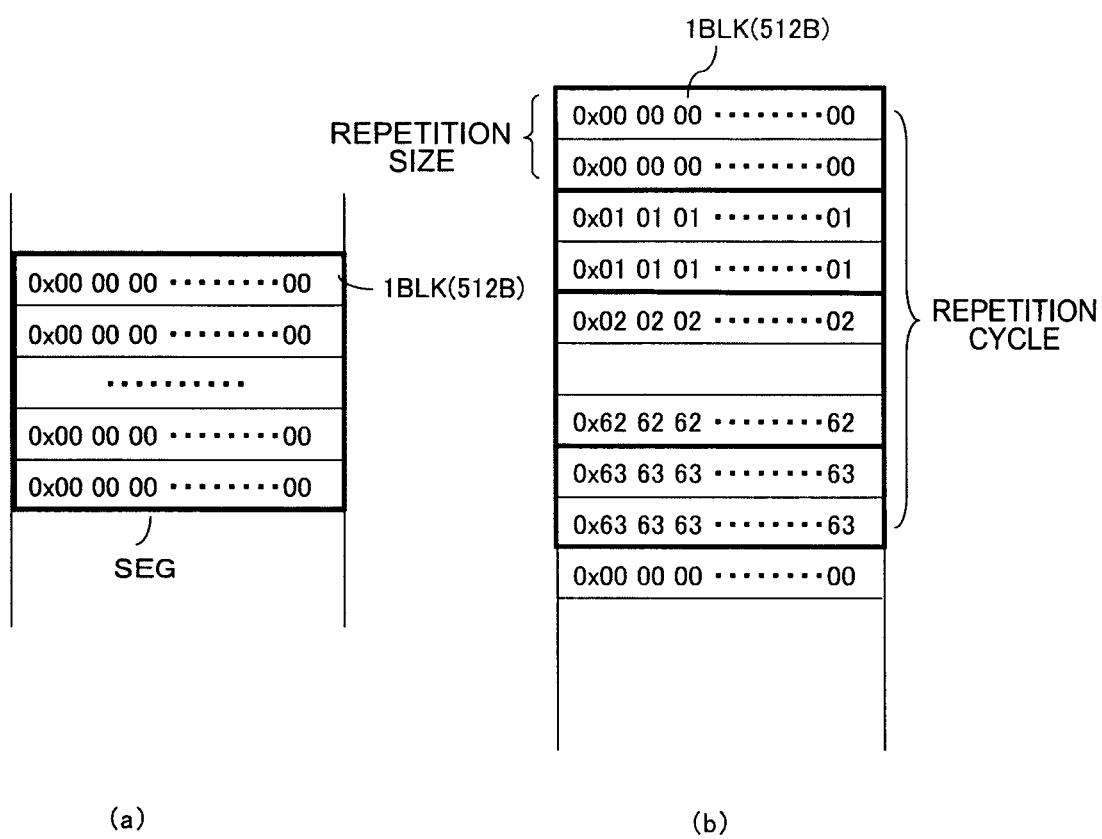
FIG. 3 is an explanatory diagram of a sample combination of fixed data.

(a) in FIG. 3 illustrates a pattern where all the pieces of data included in one block (BLK) are "zero." A segment (SEG) is comprised of n blocks. The storage system determines that the segment corresponding to (a) is "fixed pattern."

On the other hand, (b) illustrates the case where one block is comprised of multiple pieces of data with the same value, multiple blocks configure the "repetition size," and multiple repetition sizes make up the repetition cycle. In this repetition cycle, the value of data serially changes according to each repetition size. The storage system determines that what is illustrated in (b) is also a fixed pattern.

If multiple pieces of data included in transfer information are all the same, or if the combination or the change of multiple pieces of data has a certain pattern, the storage system determines that the transfer information is a fixed pattern. The microprocessors of the storage system, based on the management program of the local memory, determine that the pattern of transfer information and the segments is a fixed pattern.

Each segment is comprised of fixed patterns, random patterns or a mixture of both. Note that the storage system treats a mixture of both of the patterns as a random pattern.

The description of FIG. 2 is continued below. The de-duplication in units of segments is executed on a fixed pattern first ((b) to (c) of FIG. 2). The storage system examines whether each segment has a regular pattern as shown in (a) and (b) of FIG. 3, for example, and whether there are any segments with the same regularity in the storage area where the information is stored. If both of the above are determined to be true, or if just the former—that each segment has a regular pattern—is determined to be true, the storage system considers the segment that is the object of the fixed pattern determination to be a "redundant segment" ((c) of FIG. 2), and excludes it from those to be stored to the storage device. That is, a redundant segment is not intended to be stored in the storage device. As for the decision regarding whether multiple segments to be compared with each other share a regular pattern, a direct decision based on the value of the pattern is all that is required, and the operation to find the hash mean is not necessary. If the data included in a block or in a segment is all the same or has any regularity, the same value of data or the value of data with the regularity corresponds to the pattern value.

Next, the storage system examines the multiple segments that comprise transfer information, which are remaining after the redundant segments with the fixed pattern are excluded, to see whether they have the same random pattern as the segments stored in the storage device, and the segments which have the same pattern are determined to be "redundant segments." The matching of the random pattern is determined according to the determination result of the hash mean matching in the multiple segments to be compared with each other. The segments with the same hash mean are, as redundant segments (as in (d) of FIG. 2), excluded from the object of the further processing.

The storage system then executes the data compression processing for the transfer information from which the redundant segments identified in (c) and (d) of FIG. 2 have been excluded (as in (e) of FIG. 2). The unit of data compression is not limited to segments, and it can be executed on multiple segments at a time or to multiple blocks that comprise a segment.

The data compression processing reduces the amount of transfer information. The data amount basically varies depending on each unit of compressed data. Finally, based on the compressed data, the storage system creates destaging blocks which are the units of information to be stored in a storage device, and stores them in the storage device ((f) of FIG. 2).

In the processing sequence illustrated in FIG. 2, the redundant segment detection by focusing on fixed patterns precedes the redundant segment detection by focusing on random patterns so that the number of segments targeted by hash mean operations will be reduced by excluding redundant segments related to fixed patterns from transfer information in advance. This is because the high-precision determination of random pattern matching makes the hash mean operations heavier. By excluding redundant segments with fixed patterns from transfer information in advance, the latency of the processing for storing transfer information in the storage device can be kept to a minimum.

On the other hand, in the de-duplication processing, since the segments themselves have been excluded, compared with the data compression process, redundant information stored in the storage device is reduced more effectively. Therefore, the processing of excluding redundant segments precedes data compression. In particular, as the object of data compression is limited to the segments remaining after excluding redundant segments, the latency of compression is kept to a minimum while data compression allows the storage capacity to be utilized effectively.

Figure 4:
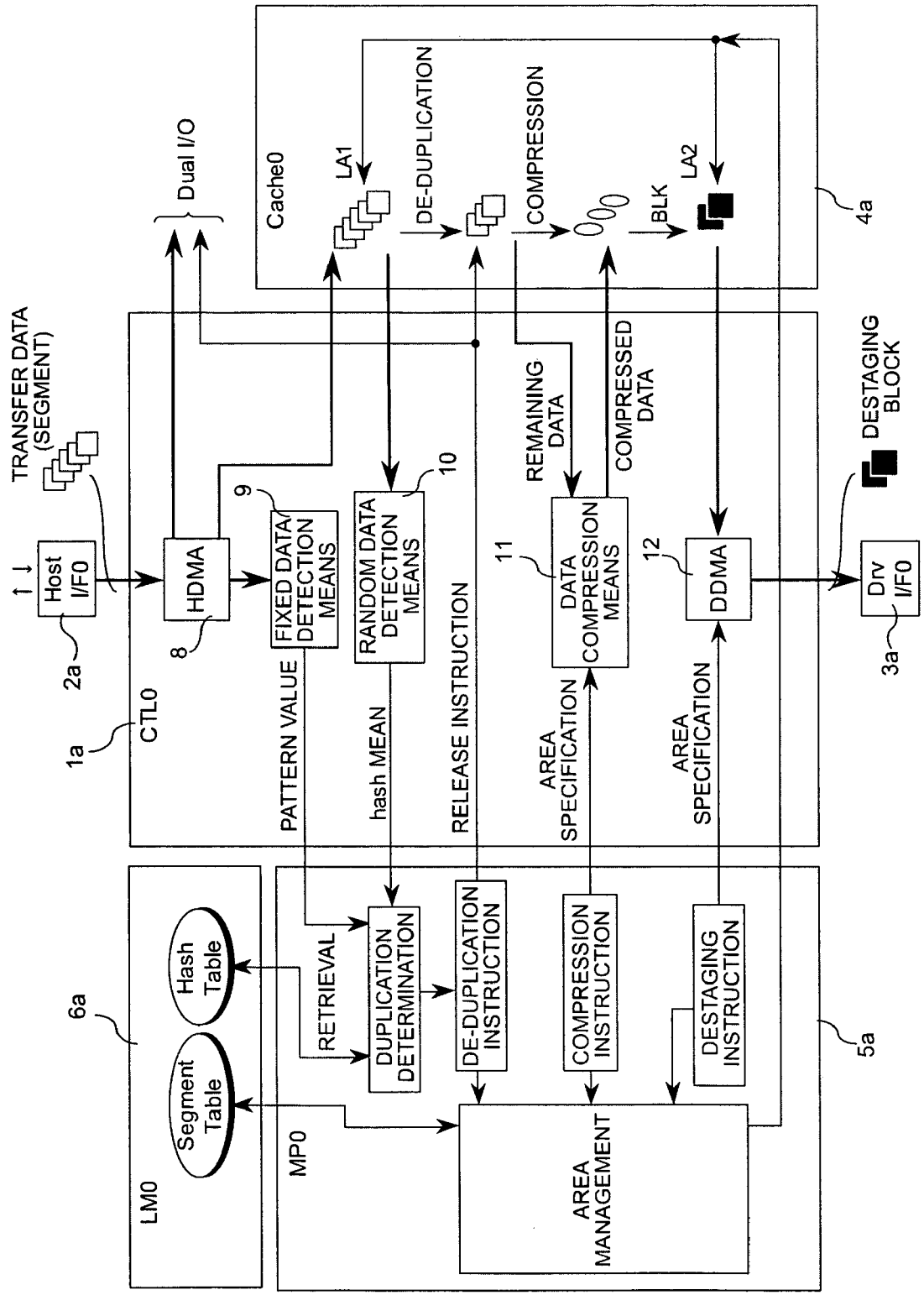
FIG. 4 is an explanatory diagram showing the process of de-duplication and data compression utilized in the storage system.

Next, a more detailed configuration of the storage system that realizes the processing shown in FIG. 2 is described below. FIG. 4 is a block diagram of the function of the storage system. The storage system 100 realizes the de-duplication process ((a) to (d) of FIG. 2) and the data compression process ((e) and (f) of FIG. 2) by linking the controller, the cache memory and the microprocessor. Note that FIG. 4 illustrates the operation and configuration related to one controller as a representative example of the redundant controllers. The controller 1a has an HDMA8 that controls the data transfer between the host interface 2a and the cache 4a, and the data transfer with the other controller 1b by dual I/O.

Furthermore, the controller 1a has a fixed data detection means 9 (detection part or detection circuit) that detects the pattern value of the information (segments) with fixed patterns and a random data detection means 10 that executes the hash mean operation of the information (segments) stored in the cache 4a.

The controller 1a also has a data compression means 11 that executes the compression process on the data stored in the cache 4a and DDMA12 that controls the data transfer between the data in the cache 4a and the drive interface.

Next, the operation of the microprocessor 5a is described below. The microprocessor 5a has a processing part or processing means that executes the processing illustrated in FIG. 4. That is, the microprocessor realizes the segment redundancy determination based on the pattern value and the hash mean, and when redundancy is detected, releasing the area which is redundancy segment in the cache area i.e. the exclusion instruction for allowing other transfer information to be written to the released area, the compression instruction by specifying the cache area to be compressed and controlling the start of the data compression means 11, and the de-staging instruction by starting DDMA12 and controlling the transfer of the compressed data in the cache area to the drive interface 3a.

The microprocessor 5a, in storing transfer information in the cache memory, adds an address (Logical Address LA1) to each block. With the aid of the logical address, the higher-level device can access the information stored in the storage device. However, the above-described de-duplication and data compression spoil the correspondence of the block addresses in the access space seen from the higher-level device and the addresses of the corresponding destaging blocks. Therefore, the microprocessor executes area management of the access space for the purpose of managing that correspondence.

As data compression by the microprocessor reduces the data amount, the blocks that are the objects of the compression cease to correspond to the destaging blocks that have been created from the compressed data. Accordingly, the microprocessor adds a new address (LA2) to the destaging blocks created from the compressed data so that the blocks at information transfer from the host to the storage system correspond to the destaging blocks.

The use of the local memory by the microprocessor is described below. The local memory is used for redundancy detection for random patterns, and it has segment information that has already been stored in the storage device (such as addresses) and a hash table that manages the correspondence with the hash mean for each segment. By examining the matching of the hash mean calculated from transfer information and the hash mean registered in the hash table, the presence of redundant segments corresponding to random patterns is determined.

In addition, the local memory 6a has a segment table that manages the correspondence of the address of the access space seen from the higher-level device (logical volume) with the destaging blocks. The details of those tables are described later.

Figure 5:
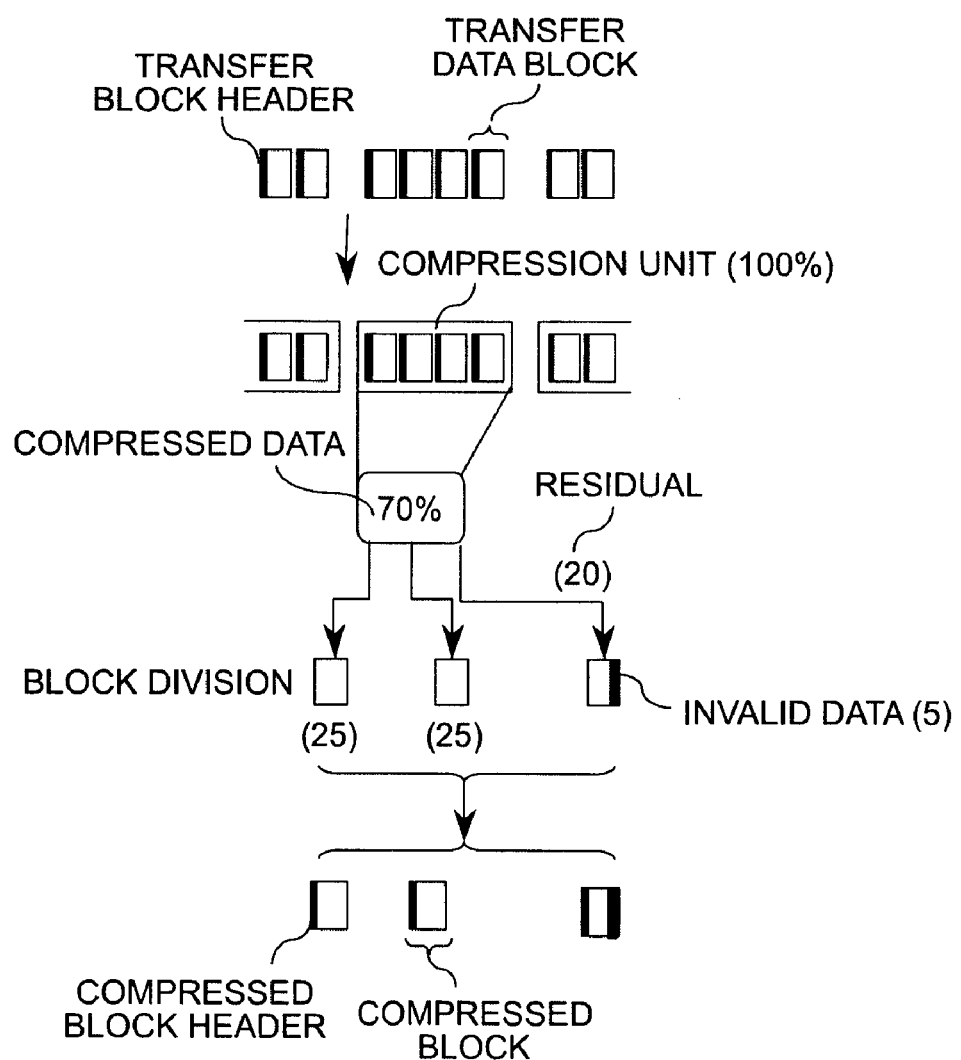
FIG. 5 is an explanatory diagram showing a method of creating compressed blocks.
Figure 6:
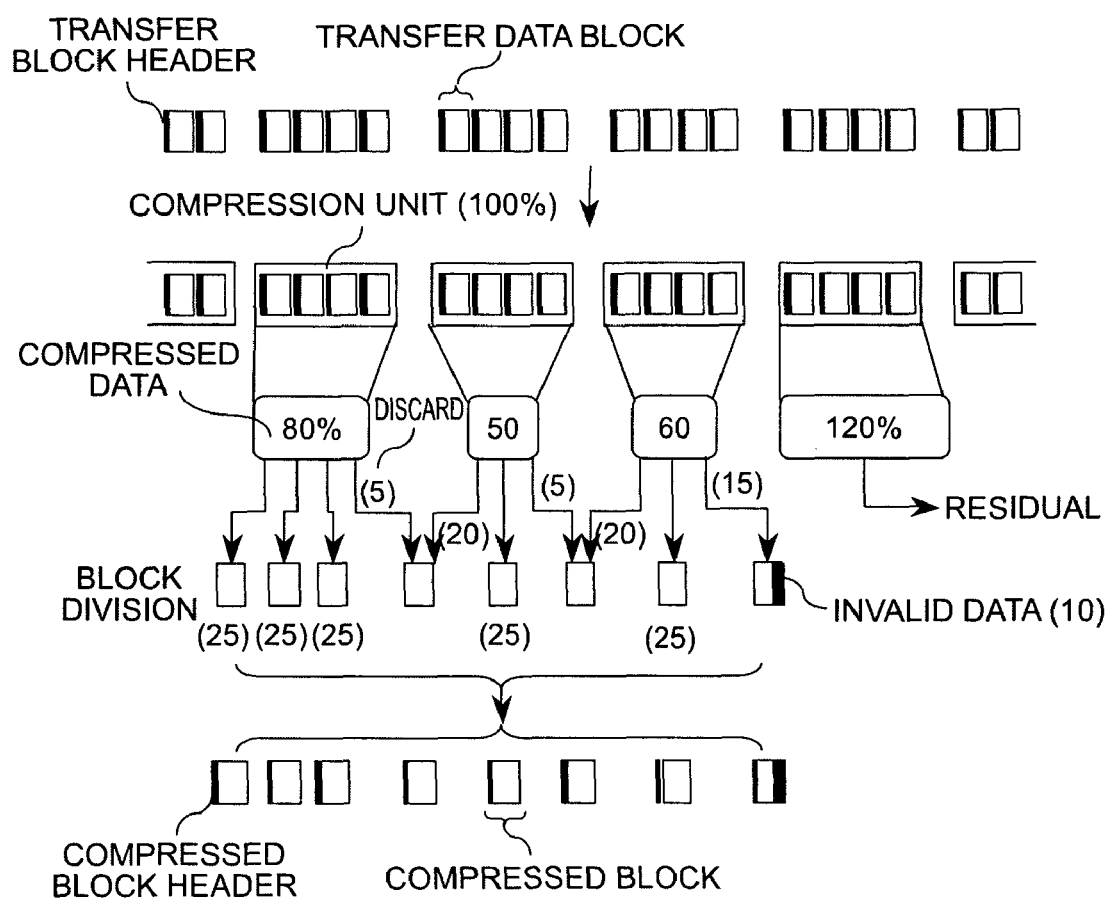
FIG. 6 is an explanatory diagram showing another method of creating compressed blocks.

Next, the processing of compression (examples of creating destaging blocks including compressed data (compressed blocks), examples of the block configuration, and the method of creating compressed blocks) is specifically described below. FIG. 5 and FIG. 6 show examples of creating compressed blocks. A unit of data compression is comprised of multiple blocks that make up transfer information. FIG. 5 and FIG. 6 show examples where four blocks comprise a unit of data compression. Data compression is executed on each such unit. The data compression unit includes headers such as the address at the time of transfer added to the transfer block (LA1). Only the transfer information except for the headers being the object of compression may also be allowed.

FIG. 5 describes the creation of compressed blocks where, as a result of the data compression processing, the data amount included in the data compression unit (100%) has been compressed to 70%. The compressed data that has been reduced to 70% compared to the data amount for the transfer information is divided into destaging blocks (the proportion of data amount per unit is 25%, as 100% divided by 4 blocks). The data will be divided into three destaging blocks which are 25%, 25% and 20%. The block with 20% of the data amount assigned to it is a compressed block with 5% invalid data.

For the controller or the microprocessor to create such a compressed block, to the area in the cache memory where the compressed data is stored, cache addresses that correspond to the block data amount are specified, and by reading data by that unit, compressed blocks are created. Even if the block data amount requirement is not satisfied, transferring compressed blocks including invalid data is realized by reading the amount of block data from the cache memory. It is also possible for the microprocessor to write a special pattern as invalid data to the relevant area of the cache memory to satisfy the block data amount requirement. The microprocessor, furthermore, adds compressed block headers and creates compressed blocks.

In the example of FIG. 5, as a result of data compression in a compression unit (4 blocks), the number of compressed blocks has become 3, which means the compression is effective. The result of creating compressed blocks can be the number of blocks before compression being equal to the number of blocks after compression. In that case, the microprocessor discards the compressed data, considering the compression ineffective.

Figure 7:
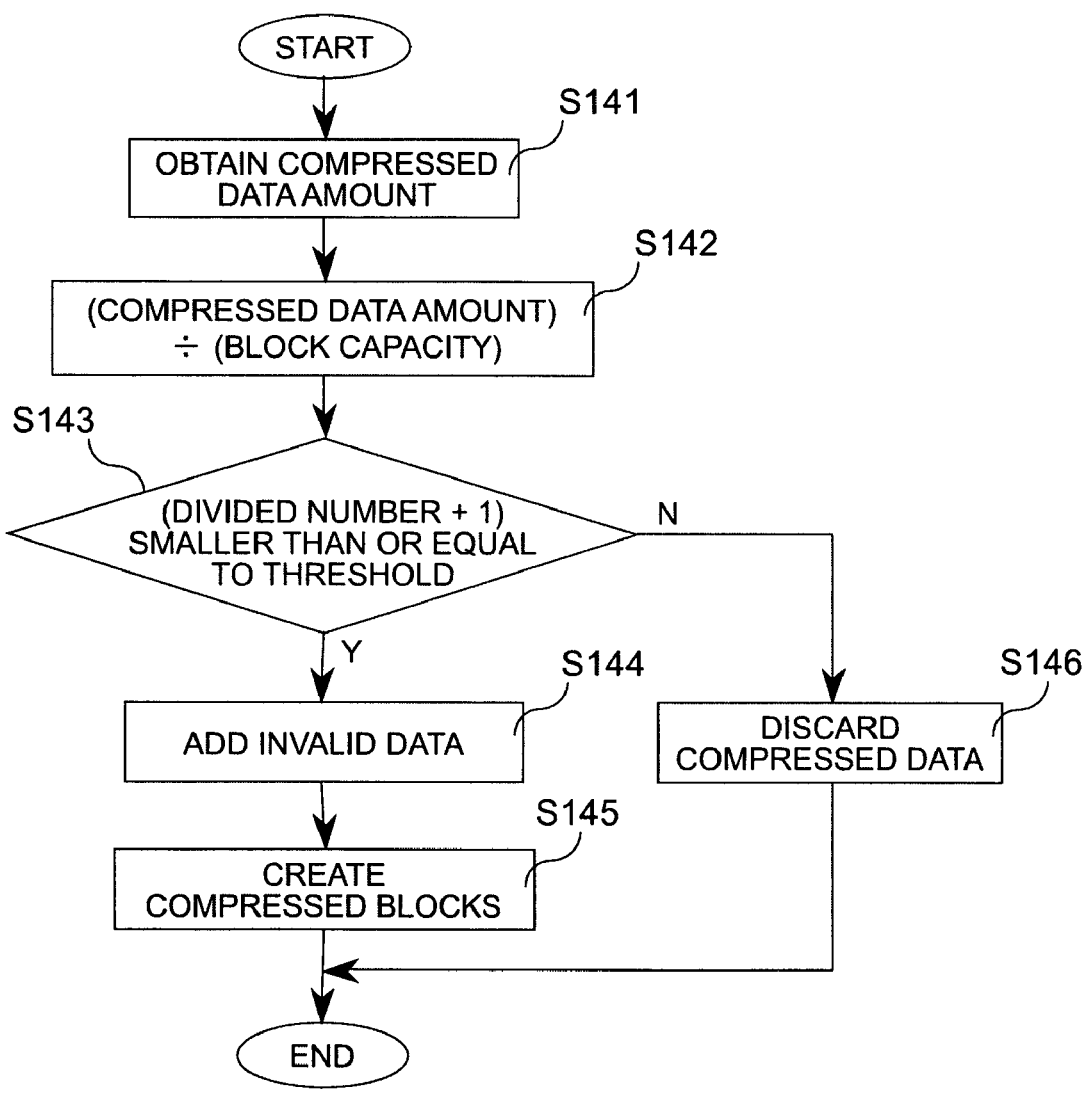
FIG. 7 is a flowchart showing a method of creating compressed blocks.

The process of creating compressed blocks shown in FIG. 5 is described using the flowchart showing the operation by the microprocessor 5a or the controller 1a. FIG. 7 describes the method of creating compressed blocks when there is a single data compression unit.

The microprocessor ascertains the amount of data that can be obtained from the data compression unit (S141). The amount of compressed data can be ascertained by the storage range of compressed data in the cache memory. By dividing the compressed data amount by the data amount to be assigned to the compressed block in S142, the division number for the compressed data and the number of residual bytes are calculated.

In S143, the microprocessor compares the number of blocks required to store compressed data including the residual (division number plus 1) with the threshold. The microprocessor, with four as the number of blocks included in a data compression unit for example, gives as the threshold three or fewer blocks to which compression will be effective.

If fewer than the threshold in S143, the microprocessor adds invalid data to the cache area that follows residual bytes (S144), and adds a compressed block header. In S144, there are some cases where the microprocessor does not add invalid data by reading the data amount of the block from the cache memory. Finally, the microprocessor reads the compression block header and the compressed data in the amount equal to the data amount to be assigned, stores it in the storage device as compressed blocks, and updates the segment table. The update of the segment table will be described in FIG. 10. If the threshold is exceeded in S143, the compressed data storage area in the cache is released, the compressed data is discarded (S146), and the transfer blocks, unchanged from their pre-compressed status, are stored in the storage device.

FIG. 6 shows the process of creating compressed blocks from multiple pieces of transfer data. As multiple pieces of compressed data will be the object, the pieces of data for which compression is found ineffective are excluded. The total amount of three pieces of compressed data is divided into blocks. Therefore, compressed data is divided into blocks regardless of borders between the pieces of compressed data, and any amount insufficient for the block data amount is assigned to the block which includes invalid data. After the division into blocks, compressed blocks are configured by adding compressed block headers. The process of dividing data into blocks and creating compressed blocks is executed, in the same way as FIG. 5, by specifying and accessing the compressed data storage area in the cache.

Figure 8:
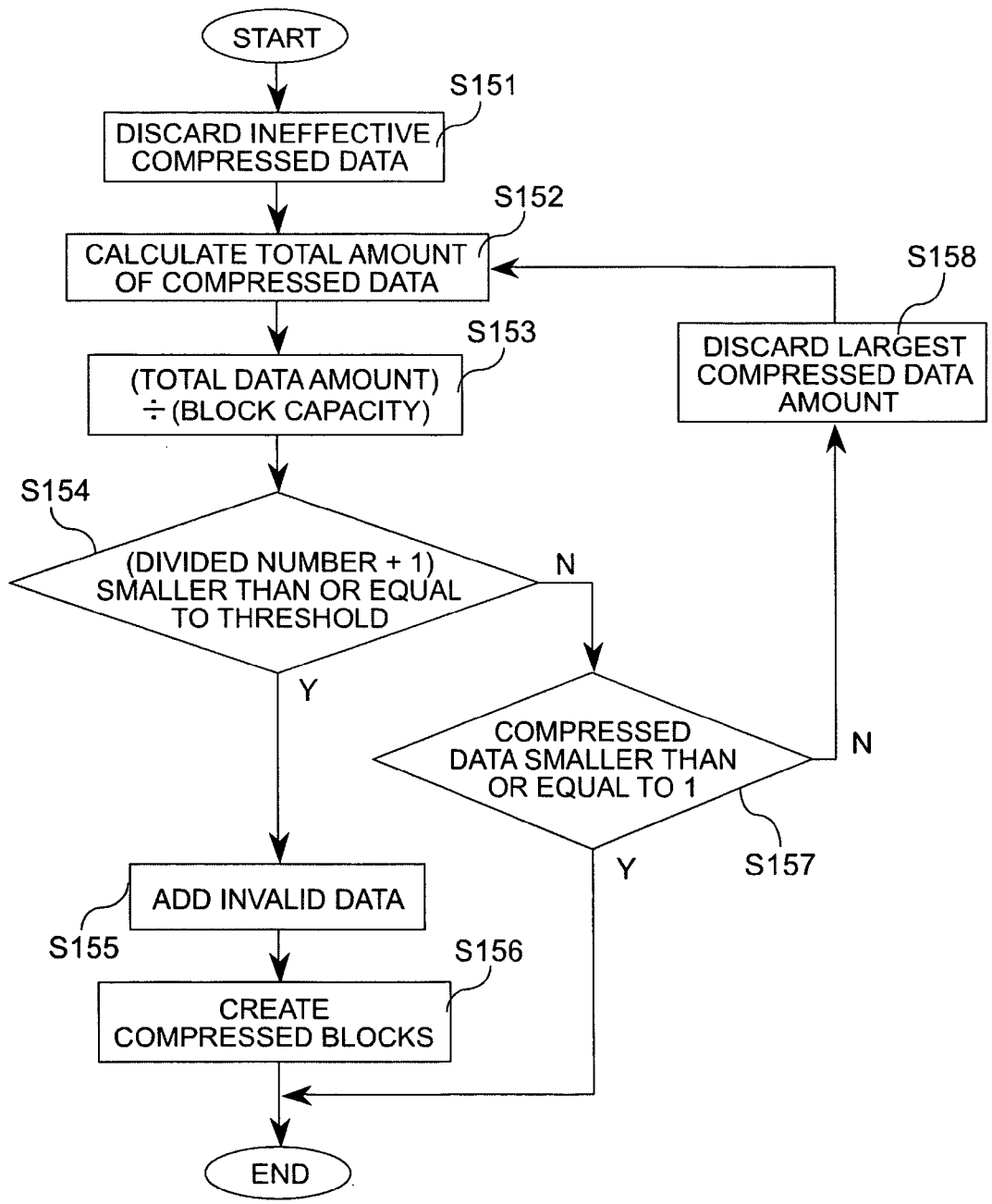
FIG. 8 is a flowchart showing another method of creating compressed blocks.

The method of creating compressed blocks shown in FIG. 6 is described next. FIG. 8 is a flowchart showing the method of creating compressed blocks from multiple data compression units. The microprocessor finds out the compressed data amount obtained from each compressed data unit and discards compressed data for which compression turns out to be ineffective (releasing the relevant cache area in S151). The amount of compressed data can be ascertained from the compressed data storage area in the cache.

In S152, the microprocessor calculates the total data amount corresponding to the compressed data remaining in the cache memory. The processing from S153 to S156 is based on the total data amount and corresponds to the processing from S142 to S145 in FIG. 7.

In S154, if the case in FIG. 6 is true, for 12 as the number of transfer blocks for multiple pieces of compressed data, the microprocessor gives 11 or fewer blocks for which compression is effective as the threshold. The threshold is not always fixed, and it can vary depending on the number of transfer blocks for multiple pieces of compressed data to be the object of the processing.

In S154, if the number of blocks including the residual (division number plus 1) exceeds the threshold, the microprocessor determines the number of compressed data pieces as the object for block division (S157). In S157, if the microprocessor determines that there is a single piece of compressed data, it discards the compressed data, and stores the corresponding transfer block uncompressed in the storage device. Otherwise, the microprocessor executes the processing for a single piece of compressed data described in FIG. 5.

If the microprocessor determines that S157 resulted in failure, it discards, for example, the compressed data piece with the largest data amount (S158), and executes the processing for the remaining compressed data from S152. In S158, the microprocessor stores the transfer block corresponding to the discarded compressed data, in the storage device, uncompressed. The above described processing is intended for multiple compressed data units included in the compressed data excluded in S151 although the processing is not always executed for a fixed number of pieces of compressed data.

As mentioned above, in creating compressed blocks, by dividing multiple pieces of compressed data into blocks, the amount of invalid data included in the divided blocks can be controlled, and for the methods shown in FIG. 5 and FIG. 7 intended for a single piece of compressed data, the number of compressed blocks can be controlled.

Figure 9:
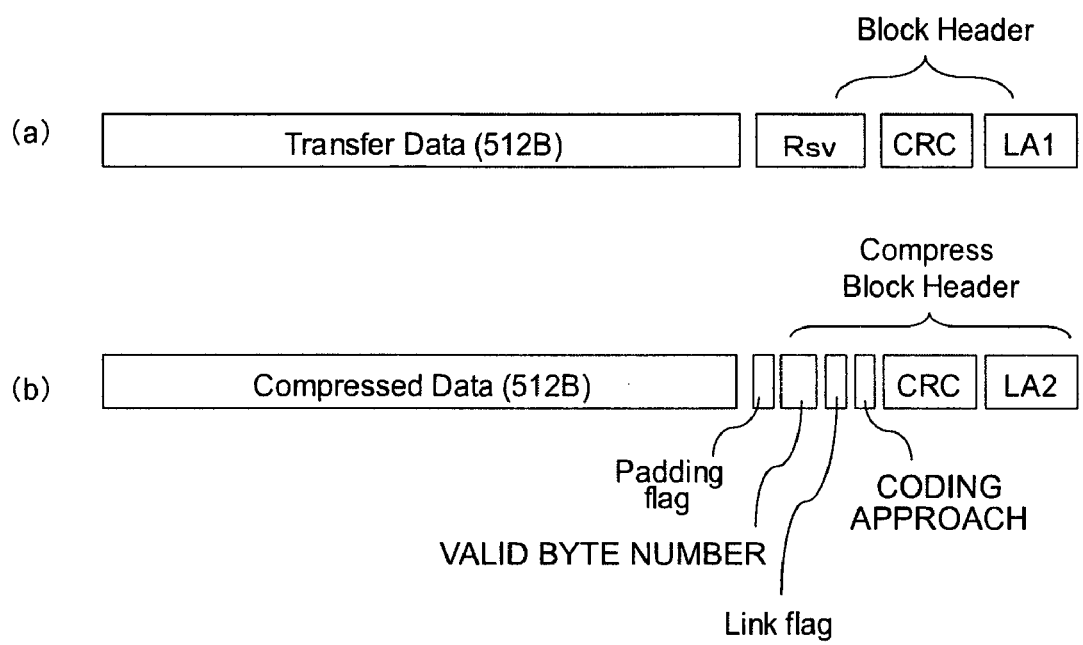
FIG. 9 is an explanatory diagram of a configuration example of a transfer block and a compressed block.

FIG. 9 shows configuration examples of a transfer data block (a) and a compressed block that stores compressed data (b). The transfer data block is comprised of a block address (LA1) used for access from the higher-level device, block headers made up of a compensating code and a reservation bit, and the transfer data. The compressed data block is comprised of compressed data and the block headers for it.

The compressed data corresponds to the compression units comprised of multiple data blocks including block headers. Block headers are made up of the newly added compressed block address (LA2) for storage in and access to the storage device intended for the compressed data, and of a compensating code. In addition, in the reservation bit of the configuration example (a), for example, the padding flag to identify invalid data, the number of valid bytes to indicate the compressed data amount except for invalid data, the link flag to recognize that the block includes different compressed data, and the coding algorithm identification information (coding approach) utilized in the data compression process are included.

In storing the compressed block from the storage device to the cache, the link flag helps recognize that all pre-block-division compressed data is present. The coding approach, in decoding compressed data, identifies the decoding algorithm to be utilized. It also identifies compressed blocks that include compressed data. The padding flag helps identify the last compressed block of the multiple compressed blocks in the compression unit.

For creating a compensating code included in the configuration example of the compressed block (b), for example, compressed data in the cache is read, and when storing it in the storage device, the compensating code is calculated simultaneously with reading compressed data and added as a compressed block header.

Based on the function blocks of the storage system shown in FIG. 4, the operations of de-duplication, data compression and destaging, which have been described in FIG. 2, are described below. Segmentation shown in (b) of FIG. 2 is realized by managing the cache memory area, in which the controller 1a stores transfer information, in units of segments. Access, such as a release instruction for the cache memory area, is executed by the controller 1a in units of segments, managed by the microprocessor. The HDMA8 transfers transfer information to the cache memory, and simultaneously, transfers it by Dual I/O to the controller 1b of the other series and to the cache memory 4b (multicast), so that a duplicate of the transfer information is kept.

De-duplication for fixed patterns as shown in (c) of FIG. 2 is executed, as soon as the HDMA stores transfer information in the cache memory 4a, by the fixed data detection means 9, which examines the data pattern of each data amount in units of blocks or segments, and transfers the pattern value to the microprocessor 5a. The microprocessor 5a, based on the obtained pattern value, determines whether there is a fixed pattern (e.g. as in FIG. 3).

Pattern values are obtained by the fixed data detection means as a result of detection executed in units of bytes to the transfer data that is sequentially stored from the HDMA to the cache memory. It is the equivalent of, for example, in the range of the transfer data amount in units of blocks, all the pieces of byte data determined to be the same, and in units of serial multiple blocks (segments), the pattern value being determined to be the same or periodical.

The microprocessor 5a determines redundancy when it detects a fixed pattern, and it creates an "exclusion instruction" and sends it via the controller 1a to the cache memory 4a. The cache memory 4a releases the area where the segment with the fixed pattern is stored. To the released area, write to new cache access is allowed, and managed as free space. In addition, to the transfer data which is already kept in duplicate in the cache memory of the other series, release is applied. That is, the cache memory 4a of the first series and the cache memory 4b of the second series are made equal in their use status.

The de-duplication processing for the segments with a random pattern described in (d) of FIG. 2 is executed for the segments remaining after the segments with a fixed pattern are excluded. The microprocessor 5a accesses the area of the cache memory 4a where the remaining segments are stored. The start of the random pattern detection means 10 is controlled. The means 10 detects the segments with the random patterns, calculates the hash mean of each relevant segment, and transfers the hash means to the microprocessor 5a.

The microprocessor 5a examines the matching of the calculated hash means and the hash means for the segments already stored in the hash table (redundancy detection). If any matching is detected, in the same way as for the segments with a fixed pattern, it releases the area of the cache memory occupied by the segments with a random pattern.

Data compression in (e) of FIG. 2 is executed for the data in the cache memory that remaining after excluding redundant segments. The microprocessor 5a specifies the area where the data compression means 11 accesses the segments remaining in the cache memory. The data compression means 11 executes the data compression processing in units of data compression units (in blocks which are the configuration units for each segment or in multiple blocks). The microprocessor 5a stores compressed data in another area saved in the cache memory. The cache area used for storing compressed data is saved in the same size as the amount of data included in a data compression unit, for example. When compressed data is stored in the saved area, there might be cases where more write is executed than the size of the saved area, or where the compressed data amount is nearly equal to the data compression unit, which means the compression is not effective. In such cases, the microprocessor 5a discards the stored data (area release).

The process of creating destaging blocks described in (f) of FIG. 2 is executed for compressed data. The data compression means 11 creates destaging blocks by adding to the compressed data stored in the cache a new address (LA2) besides the original address in each block of data (LA1) and a compensating code for the compressed data. As for the blocks to which data compression is ineffective in FIG. 7 and FIG. 8, the pre-compressed blocks are destaging blocks.

The microprocessor 5a starts DDMA, creates destaging blocks by adding headers for compressed blocks following the above mentioned description simultaneously with reading compressed data stored in the cache memory, and stores destaging blocks in the storage device via the drive interface 3a. After storing, the destaging block area of the cache memory is released. As for the other cache, similarly, the corresponding area is released.

Note that, in FIG. 3, as an example, the configuration is described where the pattern value and the hash mean detection, data compression and destaging block creation are executed in the controller 1a, and the cache memory 4a is connected to the controller 1a, but another configuration is possible where the cache memory 4a is connected to the microprocessor 5a.

Furthermore, another case is possible where the microprocessor 5a executes the fixed pattern and random pattern detection of the controller 1a, and the whole processing of data compression. In that case, the fixed pattern detection might not be possible simultaneously as the microprocessor stores transfer information in the cache memory. In such a case, it is possible to store transfer information in the cache memory simultaneously with the random pattern detection, and then execute the fixed pattern detection to transfer information in the cache memory.

This invention does not necessarily prevent the pattern detection by the hash mean from being utilized in the fixed pattern detection. As the kinds of fixed patterns are limited, the hash mean conflict can be avoided without using any complicated operation algorithms. Therefore, in detecting fixed patterns, by shortening the algorithm utilized in the random pattern (limiting the frequency of the repeated operation) and by applying the algorithm with fewer processing steps, the processing latency can be controlled. As for the hash table, a separate table can be prepared from the random data. If the microprocessor is going to detect fixed patterns, it can use what is changed from the execution algorithm for detecting random patterns.

Note that data transfer between the cache memory and the devices is not limited to that via the DMA installed in the controller (HDMA and DDMA) but can be via a DMA installed in the microprocessor, the host, or a DMA installed in the drive I/F. In that case, the controller might not include an HDMA or DDMA, with the host interface and the drive interface connected to the microprocessor, and might only have the function of controlling the distribution of transfer data.

Furthermore, the fixed data detection means, the random data detection means, and the data compression means are not limited to being installed in the controller either. Some different means from the controller are possible, such as direct connection of special hardware to the microprocessor, or arithmetic processing for detecting fixed patterns, calculating the hash mean, and the processing of data compression by the microprocessor.

Next, the hash table in the local memory (6a and 6b) is described below. FIG. 10 shows an example of a hash table, which consists of the registered correspondence of transfer block addresses given to the volume space seen from the higher-level device (Block LA), segment numbers that are the units for de-redundancy (addresses), destaging flags (No or Yes), hash means, and destaging block addresses (De-stage LA). The microprocessor creates a hash table in the process of executing the processing shown in FIG. 2. If there are multiple volume spaces, such a table exists for each space.

FIG. 10 shows the case where all segments are made up of the same number of blocks. If the storage system can change the segment length or if the segment length is going to be changed for each space, the block address range included in that segment is changed. FIG. 10 describes that one segment equals eight blocks.

Destaging flags are for the microprocessor to determine whether to execute de-duplication for each segment (No) or to store data in the storage device (Yes). If de-duplication is executed, the address of the segment where the same pattern data as the redundant segment is stored is registered in the destaging block address. This enables the microprocessor and the controller to access the storage area where the same data pattern is stored in the redundant segment. In the segment which is the object of exclusion, instead of the destaging block address, the segment number which has the same data pattern stored in the storage device can be registered.

For storing the segment data of transfer information, the microprocessor registers the hash means for the equivalent segment in the hash table. When determining the presence of redundant segments, the microprocessor calculates the hash mean for the segment of transfer information, and examines if there is a hash mean equal to the calculated hash mean.

Using the hash table, the microprocessor manages the correspondence of the block addresses seen from the higher-level device to the destaging block addresses, that is, the correspondence of the volume space to the access space of the storage device. Therefore, access is easy from the access block that is the target of the request for transmitting transfer information to the corresponding destaging block.

Next, the segment table (FIG. 11) is described below. A segment table is, in FIG. 10, comprised of transfer block addresses, segment numbers as units of de-duplication (addresses), destaging block addresses, and identification flags for de-duplication and data compression. If there are multiple volume spaces, such a table exists for each space.

The description on segment numbers is omitted here as it is the same as in FIG. 10, except that the number of data blocks included in a segment is fixed. The segment size can be changed in every de-duplication of segments with the random pattern and the fixed pattern. Using the identification flags (de-duplication flags), the kind of de-duplication that has been executed (fixed data: Fixing, or random data: Random,) or the absence of de-duplication (No) can be identified.

The identification flag for data compression (compression flag) indicates the presence of the compression process. For de-redundant segments (redundancy flag: Fixing or Random) and the blocks whose data is not compressed (transfer address: 0x0010 to 13), "No" is registered as the compression flag. In addition, for the blocks for which data compression is ineffective (transfer address: 0x001C to 1F), "Overflow" is registered as the compression flag. The unit of data compression does not have to match the unit of de-duplication (segments). FIG. 9 shows two blocks as a unit of data compression, for example.

Here, destaging block addresses in the segment table will be focused on. For segments 0x0000 and 0x0001, de-duplication for segments with a fixed pattern or a random pattern is executed, and redundant destaging block addresses or, instead of them, the segment number with the same pattern which is stored in the storage device is registered.

Some of the fixed patterns are data patterns that are not used by the higher-level device (e.g. format patterns for a storage device). If any segments with such patterns are excluded, the storage device does not have to manage destaging block addresses. In other cases, all those patterns become the object of de-duplication, that is, they are not stored in the storage device as redundant segments.

In FIG. 11, the range from the block address 0x0010 to 13 and the range from 0x001C to 1F are data blocks where either compression has not been executed or compression is ineffective, and the destaging address is registered in the size of each block as a unit. To the data compression units shown by block addresses 0x0014 to 17 and from 0x0018 to 1B, the microprocessor assigns destaging block addresses for compressed data as block addresses. In the example of FIG. 11, two blocks are a unit of data compression, to which a destaging block address is assigned for the case where compression is effective and they are compressed into one block. As data compression reduces the data amount in a data compression unit, the microprocessor and the controller create compressed blocks (destaging blocks) by using the method described in FIG. 5 or FIG. 6.

In this way, the microprocessor, based on the segment table, can confirm the correspondence of the block addresses for the volume space seen from the higher-level device to the destaging block addresses. The microprocessor and the controller can access the destaging block addresses corresponding to the access blocks to which the higher-level device has given the transfer request, and they can decompress compressed data.

Note that the segment table is not limited to the above-mentioned configuration, and can be in any configuration as long as the correspondence of the block addresses for the volume space seen from the higher-level device with the destaging block addresses is maintained. The determination on data compression can also be executed by analyzing compressed block headers in the compressed blocks (e.g. the flag that indicates the coding approach).

It is also possible to manage the segment table by separating it into redundant segment exclusion, data compression, and unprocessed block sections. For the transfer address requested by the higher-level device, for example, the table is selected in the order of the de-duplication table, the uncompressed block table, and the compression table. As for the order of reference to the table, specifically, data compression is executed for the volumes or the areas in them that have not been accessed for a long time, and for which the probability of access from the higher-level device is considered low. Accordingly, the data compression table is set to last in the order of access to the tables. Moreover, transfer data for the higher-level device is processed (such as decompression) according to the destaging blocks managed by the referenced tables and the kinds of tables. As described above, the table configuration can vary, although the content is the same as described in FIG. 10 and FIG. 11.

Figure 12:
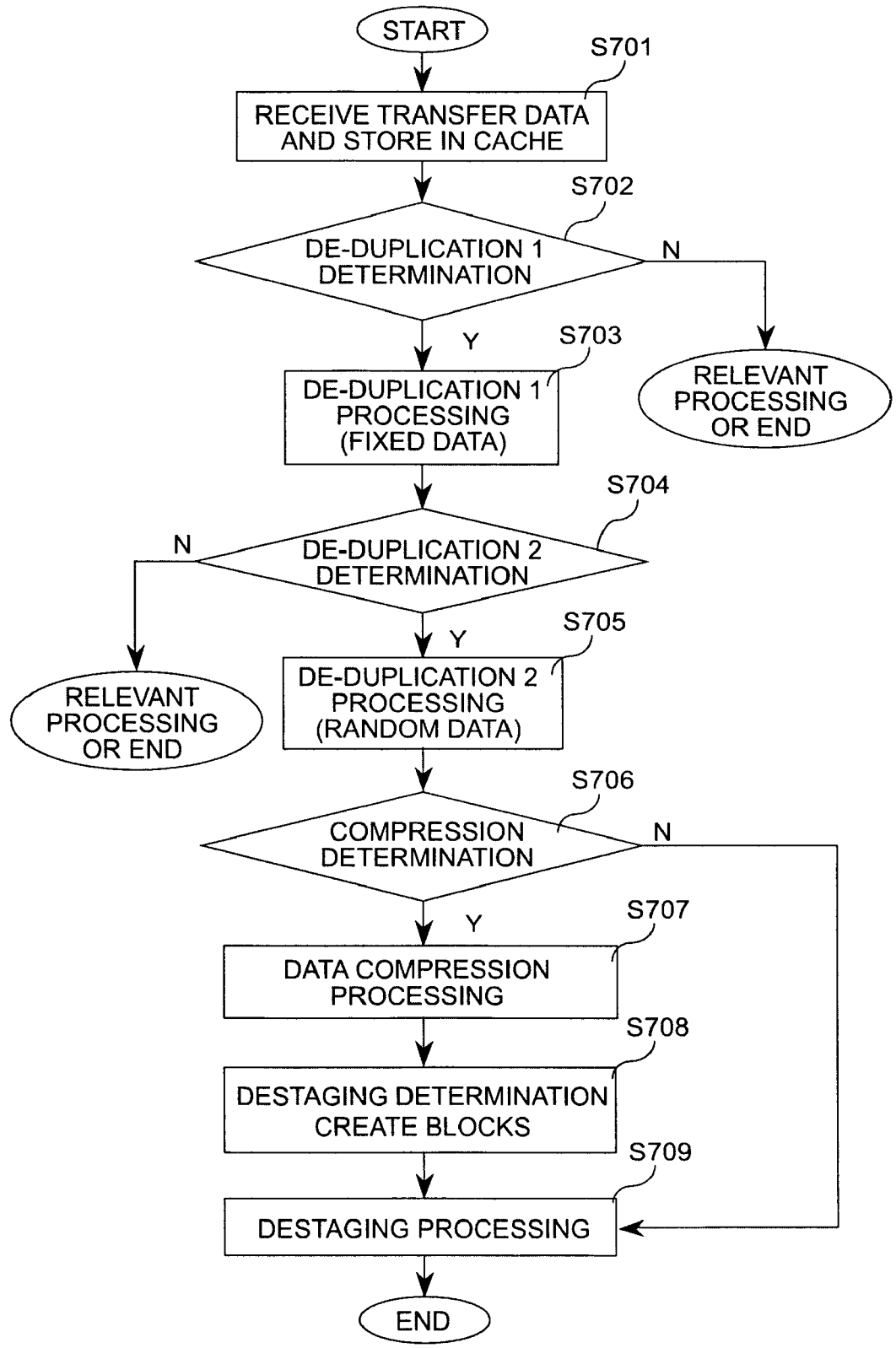
FIG. 12 is a flowchart showing the method of the collaboration between de-duplication and data compression.

Next, the process of de-duplication of transfer information and data compression, which has been described in FIG. 2 and FIG. 3, is further described below, using a flowchart (FIG. 12). The storage system usually receives transfer information and then proceeds with the above-mentioned processing in sequential processing (online processing). Online means the status where access commands from the higher-level device (data write or read) are sequentially issued to the controller, and the controller is sequentially accessing the storage device (for storage or reading). On the other hand, if the controller emphasizes response to the access commands from the higher-level device, or depending on the configuration of the storage system, the storage system proceeds with multiple processing offline or nearline. Offline or nearline means the status where there are few or no access requests from the higher-level device.

The HDMA8 of the controller 1a receives transfer information of the higher-level device and stores the transfer information in the cache memory 4a (S701). The microprocessor 5a determines the necessity of de-duplication 1 (excluding fixed patterns) (S702). In this determination, the microprocessor 5a detects segments including a fixed pattern, based on transfer information obtained from the fixed data detection means. If the microprocessor determines that it is necessary to exclude the segments, de-de-duplication of fixed data is executed in units of segments (S703).

If the decision in S702 is to skip excluding redundant segments (S703), the microprocessor 5a or the controller 1a skips all of S704, S706, de-duplication, and data compression, and proceeds to S709. Specifically, skips to S709 is selected when the storage system emphasizes response to the access commands from the host, and the processing of de-duplication and compression is executed offline (nearline) after destaging.

If the processing skips to S704, there can be a case where a fixed pattern is treated as one of the random patterns, and de-duplication of data with a fixed pattern is treated as part of de-duplication of data with a random pattern.

In S704, the microprocessor or the controller determines the necessity of de-duplication 2 (excluding redundant random patterns). If it determines the exclusion of redundant segments to be necessary, S705 executes the processing for de-duplication in units of segments of the data stored in the cache memory. If S704 determines against such exclusion, the microprocessor or the controller either skips de-duplication 2 (S705) and proceeds to S706, or skips data compression and proceeds to S709. Skipping to S709 is selected, for example, if, as a result of the previous processing (excluding redundant fixed patterns), the number of segments that are not excluded becomes zero.

As for the description above, specifically, if data compression is skipped and the processing proceeds to S709, the conditions for data to be the object of data compression might be limited.

The microprocessor determines whether the volume space or a part of the volume area without compressing has not been accessed for a long time by the higher-level device The microprocessor executes data compression for the relevant data area.

On the other hand, areas frequently accessed are left uncompressed. Thus the microprocessor saves time for decompression, and gives first priority to the system response to the transfer command. Data compression is executed when the storage system is offline (nearline).

In S706, the microprocessor determines the necessity of the data compression processing. If it determines the processing to be necessary, it follows the description in FIG. 5 and FIG. 6, creates compressed blocks (S707 and S708), and executes the destaging processing (S709).

Figure 13:
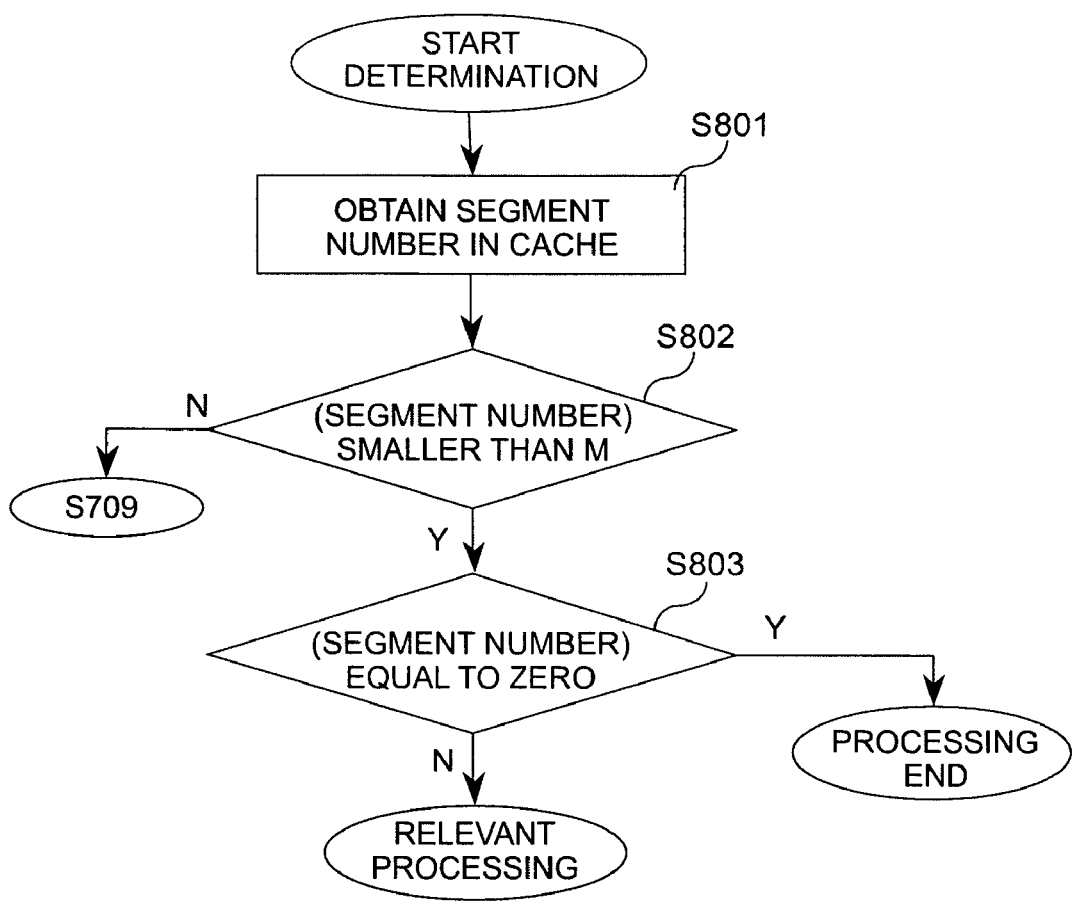
FIG. 13 is a flowchart showing the method of determining whether to execute de-duplication and data compression.

If the microprocessor makes determinations in S702, S704 and S706, the number of segments remaining in the cache memory can then be addressed. As shown in FIG. 13, the microprocessor ascertains the number of segments in the cache memory (S801). The number of segments is calculated by the microprocessor through obtaining the data amount via the controller from the cache memory and dividing it by the data amount for a segment. The microprocessor compares the number of segments with the threshold M (where M is a positive integer equal to or larger than 1) (S802). On condition that the number of segments is equal to or larger than M, the microprocessor executes S709 for the destaging of the block data. On condition that the number of remaining segments is smaller than M, the microprocessor further determines the presence of segments (S803). If the number of remaining segments is equal to zero, which means there is no segment or destaging data to be the object of the processing, the processing is complete. In S803, if the number of remaining segments is not equal to zero, the related processing is continued. When utilizing the processing of FIG. 13 in the determination of S702, the processing starts with S703 or S704; when utilizing it in the determination of S706 and S704, the processing starts with S705 or S706; and when utilizing it in the determination of S706, the processing starts with S707.

Branching to S709 after the determination of S802 is realized if the data amount for the object of the processing is larger than or equal to the threshold M, that is, if the storage system is online with the higher-level device and the response from the storage system to the higher-level device is prioritized.

The microprocessor can change the value of M depending on the system load (nearline or offline). If the system load is light, the microprocessor increases the value of M, and increases the data amount to be the object of de-duplication and data compression.

The system load is determined by the microprocessor, based on the amount of time required for de-duplication of a segment or the processing time required for data compression for a unit of data compression, and the frequency of access commands to the storage device per unit of time.

The method of information processing related to the above mentioned embodiment focuses on the difference of data patterns included in the transfer information from the higher-level device to the storage system, so that the storage system gradually excludes redundant information as storage targets and then executes the compression processing for the information remaining after de-duplication, which shortens the length of time required after receiving information until storing it in the storage device, and enables the storage system to allow the higher-level device to utilize the storage capacity effectively.

Note that, while in the above mentioned embodiment, data of redundant segments is released, if it is not released or the transfer information is recorded in duplicate in the cache memory, it is allowed to release the cache memory for the first series while keeping the cache memory for the second series unreleased. Thus the loss of transfer data can be prevented in case of failure arising in the cache memory or in the controller.

Figure 14:
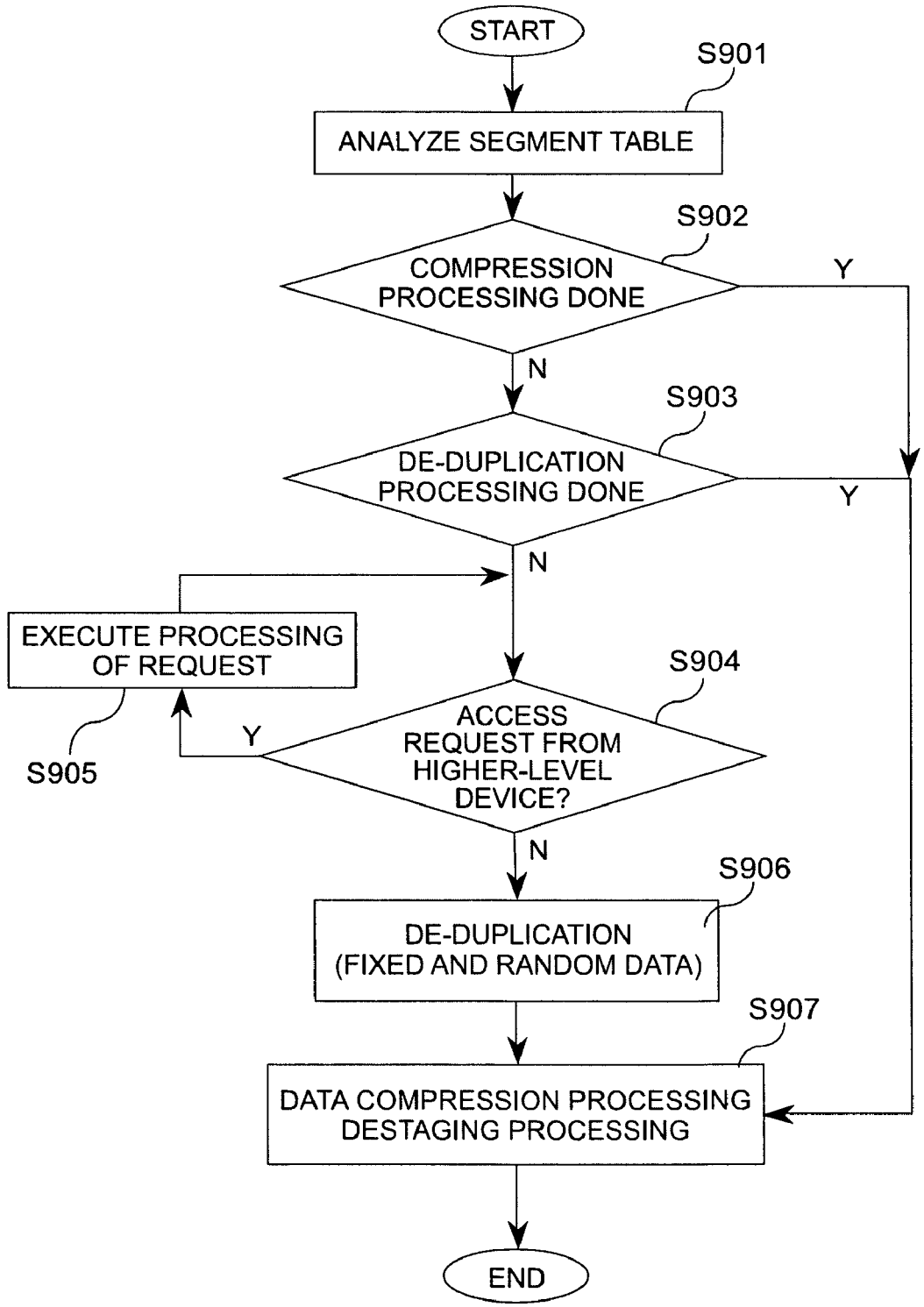
FIG. 14 is a flowchart showing the method of processing destaging data.

Next, the processing of de-duplication and data compression for transfer information stored in the storage device is described below. Such processing is executed in the determinations of FIG. 12 (S702, S704 and S706), for example, if those steps are skipped and the storage system is offline or nearline. Whether each processing has been executed or not is determined by the microprocessor by analyzing the segment table. FIG. 14 is a flowchart showing that.

Firstly, the microprocessor analyzes the segment table in the local memory and identifies the destaging blocks where no de-duplication or data compression has been executed (S901). In the segment table of FIG. 11, based on the compression flags and the redundancy flags, uncompressed blocks (without the overflow flag) and the segments that have not been the object of de-duplication are identified (S902 and S903). Furthermore, it is determined that the system status is offline (nearline) (S904).

If there is an access command from the higher-level device, the processing is prioritized and executed (S905). If the microprocessor determines that the status is offline (nearline), the processing for the segments and uncompressed blocks identified in S902 and S903 is executed sequentially (S906 and S907). In S906, as in FIG. 2, de-duplication for fixed patterns is executed first.

In the case of the segment table in FIG. 11, the segments to be the target of de-duplication are 0x0002, 0x0003 and 0x0004. By the compression flag, 0x0004 is the only segment where all the included blocks are uncompressed. Therefore, by the determination of S902, the object of de-duplication is 0x0004.

Uncompressed blocks are identified by the compression flags. They are overflow blocks for which compression is ineffective and the blocks other than compressed blocks. The microprocessor compresses uncompressed blocks, and then creates compressed blocks by the method described in FIG. 5 and FIG. 6.

Next, the method is described by which the storage system transfers (replicates) the block data stored in the storage device through the above mentioned data compression and de-duplication to the higher-level device.

Figure 15:
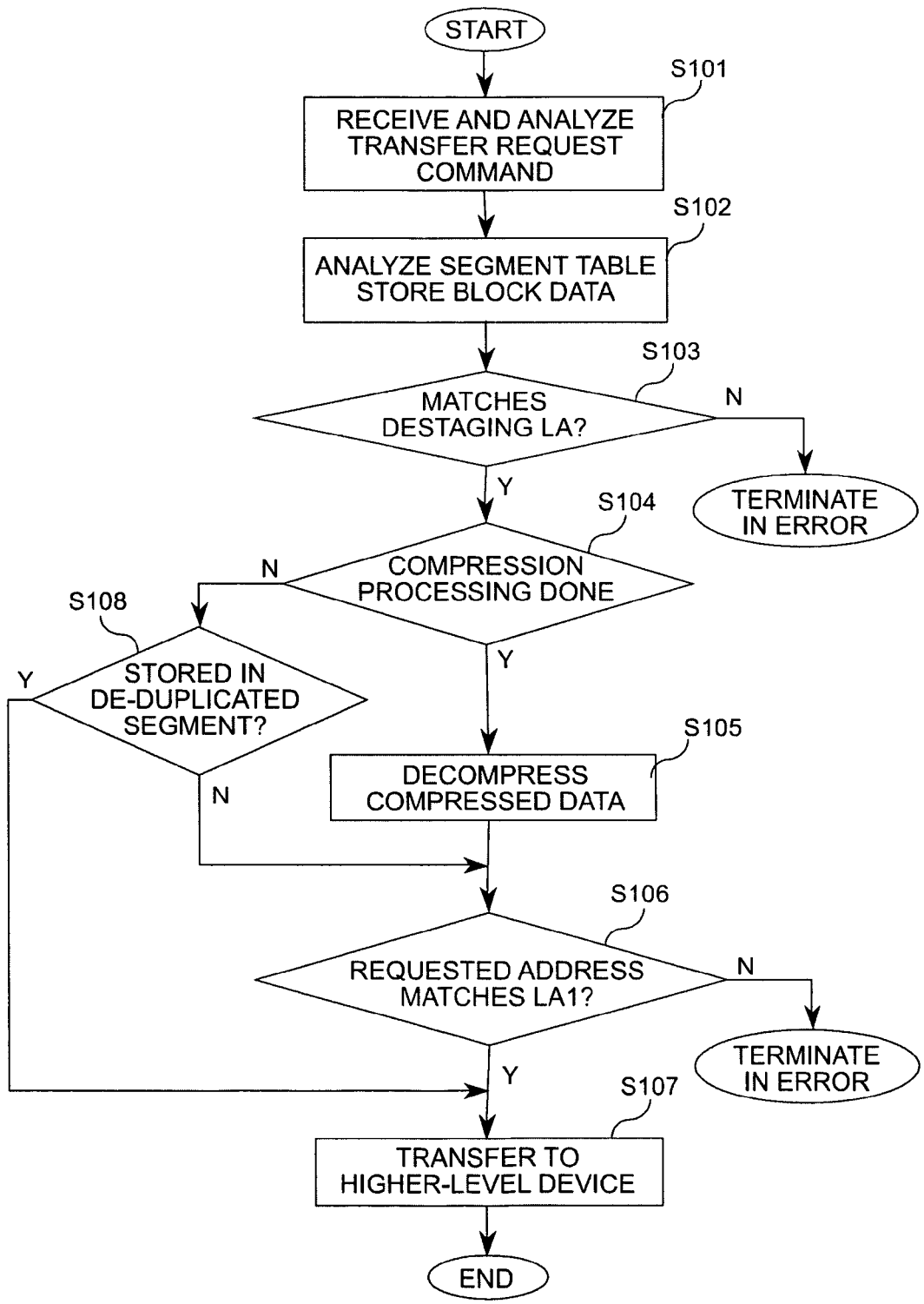
FIG. 15 is a flowchart describing the system operation in response to a transfer request from a higher-level device.

FIG. 15 is a flowchart describing the operation of the storage system for achieving that method. The storage system, in response to the access command from the higher-level device, detects the access area in the volume space (block address) (S101). The microprocessor refers to the segment table, finds out the destaging block address corresponding to the access block address, reads the block data corresponding to the block address from the storage device, and stores the block data in the cache memory (S102).

In S103, the microprocessor obtains the address information from the block header stored in the cache memory, and determines whether it matches the destaging block address found by referring to the segment table. If they are determined to not match, the flowchart terminates in an error. By this determination, the storage system ensures that the desired destaging block is stored in the cache memory.

In S104, the microprocessor examines the information stored in the cache memory. The determination is executed by using the compression flag corresponding to the block stored in the cache memory. In S104, if the microprocessor determines that the stored information is compressed information, it decompresses the compressed information, and stores the decompressed information (transfer block data) in another area of the cache memory (S105). Furthermore, the microprocessor determines whether the block address which configures the transfer blocks obtained from decompression and has been added at the time of data transfer from the higher-level device (LA1) corresponds to the block address for the access command (S106). If they are determined to not match, the whole processing is terminates in an error. If they are determined to match, the block information in the cache memory is transferred to the higher-level device (S107). As mentioned above, the storage system, when storing destaging data, after decompressing and before transferring to the higher-level device, examines the block addresses gradually.

In S104, if the microprocessor determines that the stored information is not compressed information, it is determined in S108 whether the information stored in the cache memory is included in the segment which is the object of the de-duplication processing. If it is determined to be untrue in S108, the information is determined to be uncompressed and to have not been the object of de-duplication, and the processing goes to S106. If the determination in S108 is true, the information is determined as having been the object of de-redundancy. In such case, the access request address does not match the block address stored in the cache memory, and S107 is executed. The above mentioned condition determination and the processing start control are performed by the microprocessor.

INDUSTRIAL APPLICABILITY

This invention focuses on the data patterns included in transfer information, and gradually executes the most suitable processing of pattern detection and de-redundancy. Furthermore, it executes the data compression processing intended for the data after de-duplication. It also makes determination for gradual de-duplication and data compression based on the remaining data amount in each processing step and the system load. Therefore, this invention can be widely utilized in storage systems that are configured with cache memories, hosts, storage devices, controllers and processors installed in them.

The invention claimed is:

1. A storage system, comprising:
a 1st interface that receives information transferred from a higher device,
a cache memory that stores the information temporarily,
a storage device that has a storage area for storing the information,
a 2nd interface that sends the information to the storage device, and
a control device that executes control processing with respect to the information;
wherein the control device removes from the information redundant parts that already exist in the storage area, and compresses the remaining parts and stores them in the relevant storage area, and
wherein the control device executes:
1st processing in which the information is split into a plurality of segments and processed;
2nd processing in which whether a plurality of data combinations within the plurality of segments is of a 1st pattern that has regularity is determined;
3rd processing in which whether to determine redundancy only by detection of segments making the 1st pattern, or whether to determine redundancy between segments making the 1st pattern and segments stored in the storage area is determined;
4th processing in which areas in the cache memory occupied by segments that return positive in the 3rd processing are released;
5th processing in which, from among the plurality of segments, segments other than those returning positive in the 3rd processing are determined to be segments in which a plurality of data combinations is of a random, 2nd pattern;
6th processing in which the segments having the 2nd pattern are read from the cache memory;
7th processing in which for segments having the 2nd pattern a hash value for differentiating between the differences in the 2nd pattern is calculated;
8th processing in which a hash table containing the hash values for each of the plurality of segments stored in the storage area is referenced, and whether a hash value equal to the hash value obtained in the 7th processing exists in the hash table is determined;
9th processing in which areas in the cache memory occupied by segments that return positive in the 8th processing are released;
10th processing in which information stored in areas in the cache memory occupied by segments other than those that return positive in the 8th processing is compressed;
11th processing in which one or more destage blocks, which comprise the compressed data and are units used when storing information from the cache memory in the storage area, are created; and
12th processing in which the destage blocks are stored in the storage area.

2. The storage system as set forth in claim 1, wherein the control device:

performs, using a 1st area as a unit, the determination for redundancy between the information transferred from the higher device and the information stored in the storage area, and the processing for removing as targets for the compression the redundant parts from the transferred information;
performs compression using a 2nd area as a unit on the compression targets, and creates compressed data; and
assigns the created compressed data to a 3rd area(s), and stores the relevant 3rd area(s) in the storage device.

3. The storage system as set forth in claim 1, wherein the control device adds to the 1st area in which the transferred information is stored a 1st block address set for space for access from the higher device, and
adds to the 3rd area(s) in which the compressed data is stored a 2nd block address set for space for access to the storage device.

4. The storage system as set forth in claim 3, wherein the control device comprises a local memory that comprises a control table that manages the correspondence between the 1st block address and the 2nd block address.

5. The storage system as set forth in claim 2, wherein the control device, when storing the compressed data in the 3rd area(s), calculates a number of 3rd areas from the amount of compressed data and the amount of data to be stored in the relevant 3rd area(s), and when the condition: Number of areas corresponding to data before compression $\leq M$ (M being a true integer, $M \geq$ number of 3rd areas) is satisfied, discards the compressed data; and
when the relevant condition is not satisfied, assigns the compressed data to the 3rd area(s) and stores it in the storage device.

6. The storage system as set forth in claim 2, wherein the control device, when it is determined that the amount of the information that is the target of processing for removing the redundant parts, or the compression processing, exceeds a threshold, skips the target of the relevant determination, and assigns the compressed or uncompressed information to the 3rd area(s).

7. The storage system as set forth in claim 1, wherein the control device performs compression processing with the information stored in the storage device as a target, and selects the area(s) in the storage device to be targeted by the compression processing according to frequency of access from the higher device.

8. A data processing method for a storage system, the data processing method comprising:
receiving information transferred from a higher device via a first interface,
storing the information temporarily in a cache memory,
providing a storage device that has a storage area for storing the information,
sending the information to the storage device via a second interface, and
executing control processing with respect to the information;
wherein the control processing comprises removing from the information redundant parts that already exist in the storage area, compressing the remaining information, and storing the compressed remaining information in the relevant storage area,
wherein a control device executes the control processing by:
splitting the information into a plurality of segments for processing;

determining whether a plurality of data combinations within the plurality of segments is of a 1st pattern that has regularity;

determining whether to determine redundancy only by detection of segments making the 1st pattern, or whether redundancy is to be determined between segments making the 1st pattern and segments stored in the storage area;

releasing areas in the cache memory occupied by segments that are determined to be redundant;

determining segments from among the plurality of segments other than those determined to be redundant to be segments in which a plurality of data combinations is of a random, 2nd pattern;

reading the segments having the 2nd pattern from the cache memory;

calculating, for segments having the 2nd pattern, a hash value for differentiating between the differences in the 2nd pattern;

referencing a hash table containing the hash values for each of the plurality of segments stored in the storage area and determining whether a hash value equal to the hash value calculated for differentiating between the differences in the 2nd pattern exists in the hash table;

releasing areas in the cache memory occupied by segments for which a hash value equal to the hash value calculated for differentiating between the differences in the 2nd pattern is determined to exist in the hash table;

compressing information stored in areas in the cache memory occupied by segments other than those for which a hash value equal to the hash value calculated for differentiating between the differences in the 2nd pattern is determined to exist in the hash table;

creating one or more destage blocks that comprise the compressed data and are units used when storing information from the cache memory in the storage area; and storing the destage blocks in the storage area.

\* \* \* \* \*